(12) United States Patent
Su et al.

(10) Patent No.: US 11,658,215 B2
(45) Date of Patent: May 23, 2023

(54) METHOD OF FORMING CONTACT STRUCTURES

(71) Applicant: Taiwan Semiconductor Manufacturing Company, Ltd., Hsinchu (TW)

(72) Inventors: Fu-Hsiang Su, Hsinchu (TW); Yi-Hsien Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 135 days.

(21) Appl. No.: 17/229,069

(22) Filed: Apr. 13, 2021

(65) Prior Publication Data

US 2022/0271130 A1    Aug. 25, 2022

Related U.S. Application Data

(60) Provisional application No. 63/151,108, filed on Feb. 19, 2021.

(51) Int. Cl.
*H01L 29/40* (2006.01)
*H01L 29/417* (2006.01)
(Continued)

(52) U.S. Cl.
CPC .... *H01L 29/401* (2013.01); *H01L 21/823475* (2013.01); *H01L 23/535* (2013.01); *H01L 29/41775* (2013.01); *H01L 29/41733* (2013.01); *H01L 29/41791* (2013.01); *H01L 29/42392* (2013.01)

(58) Field of Classification Search
CPC ............... H01L 21/823475; H01L 23/535
See application file for complete search history.

(56) References Cited

U.S. PATENT DOCUMENTS 9,520,362 B2    12/2016    Lin et al.
9,613,856 B1    4/2017    Yang et al.
(Continued)

FOREIGN PATENT DOCUMENTS

DE    102013104236 A1    5/2014
KR    20140022245 A    2/2014
(Continued)

*Primary Examiner* — Farun Lu
(74) *Attorney, Agent, or Firm* — Haynes and Boone, LLP

(57) ABSTRACT

A method according to the present disclosure includes receiving a workpiece that includes a first gate structure including a first cap layer thereon, a first source/drain contact adjacent the first gate structure, a second gate structure including a second cap layer thereon, a second source/drain contact, an etch stop layer (ESL) over the first source/drain contact and the second source/drain contact, and a first dielectric layer over the ESL. The method further includes forming a butted contact opening to expose the first cap layer and the first source/drain contact, forming a butted contact in the butted contact opening, after the forming of the butted contact, depositing a second dielectric layer, forming a source/drain contact via opening through the second dielectric layer, the ESL layer, and the first dielectric layer to expose the second source/drain contact, and forming a source/drain contact via in the source/drain contact via opening.

20 Claims, 15 Drawing Sheets

(51) Int. Cl.
*H01L 21/8234* (2006.01)
*H01L 23/535* (2006.01)
*H01L 29/423* (2006.01)

(56) References Cited

U.S. PATENT DOCUMENTS

| | | |
|---|---|---|
| 9,716,032 B2 | 7/2017 | Tang et al. |
| 9,972,529 B2 | 5/2018 | Yang et al. |
| 10,163,691 B2 | 12/2018 | Shih et al. |
| 10,170,322 B1 | 1/2019 | Cheng et al. |
| 2014/0361381 A1 | 12/2014 | Hung et al. |
| 2016/0336183 A1 | 11/2016 | Yuan et al. |
| 2019/0139825 A1 | 5/2019 | You |
| 2019/0287851 A1 | 9/2019 | Chen et al. |
| 2020/0043787 A1* | 2/2020 | Su .................. H01L 23/535 |
| 2020/0135912 A1 | 4/2020 | Tsai et al. |
| 2020/0411378 A1 | 12/2020 | Huang et al. |

FOREIGN PATENT DOCUMENTS

| | | |
|---|---|---|
| KR | 20180018622 A | 2/2018 |
| KR | 20180060952 A | 6/2018 |
| KR | 20180131346 A | 12/2018 |
| TW | 201421692 A | 6/2014 |

\* cited by examiner

METHOD OF FORMING CONTACT STRUCTURES

PRIORITY DATA

The present application claims the benefit of U.S. Provisional Application No. 63/151,108, entitled "Method of Forming Contact Structures," filed Feb. 19, 2021, the entirety of which is herein incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As scaling down of IC devices continues, dimensions of contact vias, such as gate contact via and source/drain contact vias, are becoming smaller and smaller. While advanced lithography techniques allow formation of high-aspect-ratio contact via openings, filling of conductive materials in the high-aspect-ratio via openings has proven challenging. Additionally, deposition of a metal fill layer on different metal surfaces may experience different deposition rates, resulting in unsatisfactory metal filling or voids. While existing methods for forming contacts to transistors are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
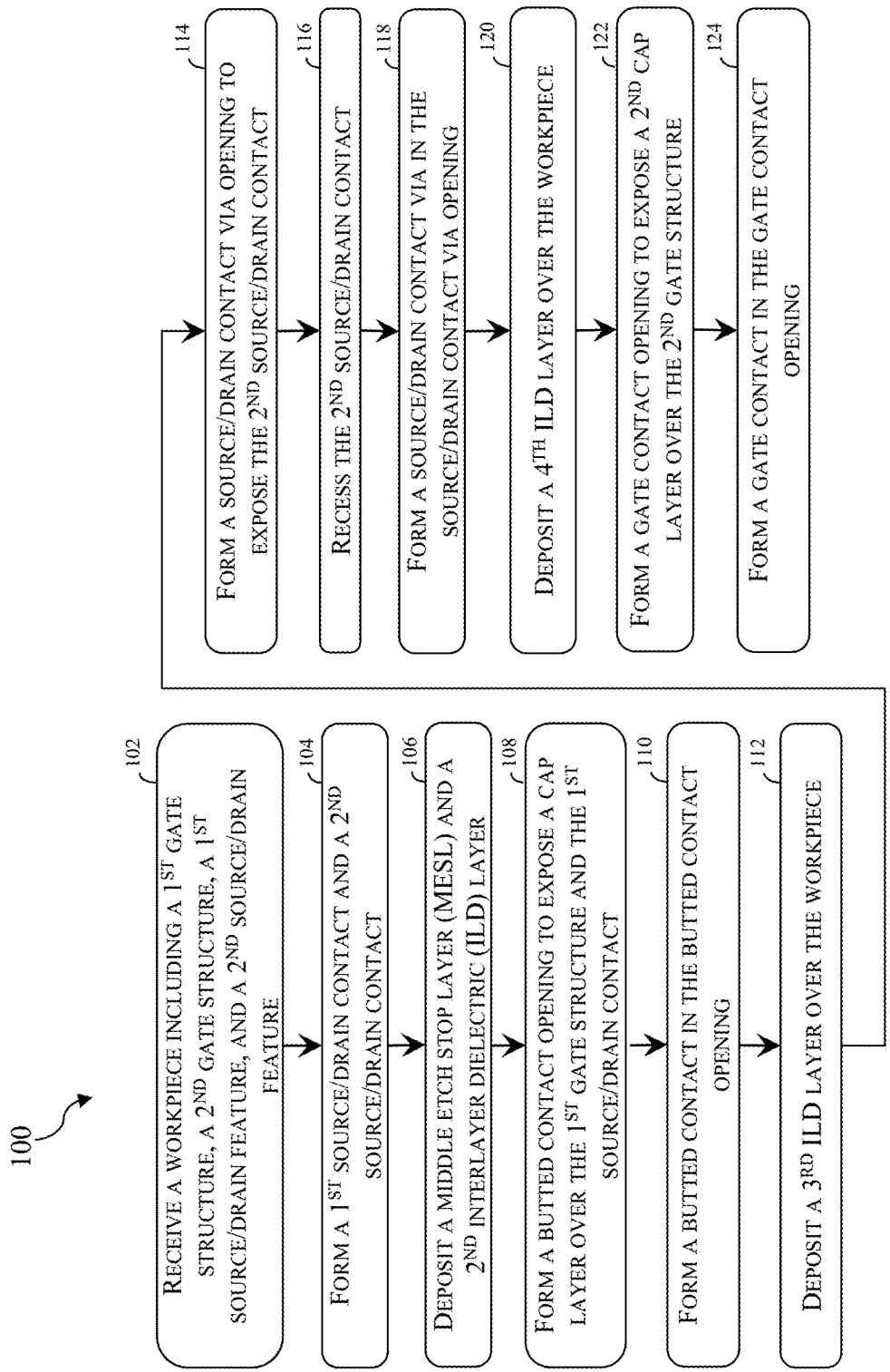
FIG. 1 is a flow chart of a method for fabricating a common rail contact, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As dimensions of semiconductor devices continue to scale down, use of a local interconnect structure to couple a gate structure and an adjacent source/drain contact becomes commonplace. In some examples, the gate structure is capped by a cap layer that is different from a composition of the source/drain contact. During the formation of the local interconnect structure, a fill layer is deposited by chemical vapor deposition (CVD) or a selective deposition method. It is observed that the fill layer may be deposited faster on the source/drain contact than over the cap layer. Additionally, before the metal fill process to form the local interconnect structure, surfaces of the source/drain contact and the cap layer may be exposed to various oxidation or reduction atmosphere. The difference in reductivity between different materials may also contribute to the differential deposition rates. The different deposition rates on different surfaces may cause the local interconnect structure to have poor contact to the gate structure.

The present disclosure provides method to form a butted contact to couple a gate structure with an adjacent source/drain contact before formation of a source/drain contact via and formation of a gate contact. A butted contact opening for the butted contact has a low aspect ratio and metal filling into the butted contact opening is performed using a combination of physical vapor deposition (PVD) and chemical vapor deposition (CVD). As a result, top surfaces of the source/drain contact via and the gate contact are higher than a top surface of the butted contact. Embodiments of the present disclosure may reduce or eliminate issues associated with differential deposition rates on different surfaces. Methods of the present disclosure reduce the possibility of void formation.

The various aspects of the present disclosure will now be described in more detail with reference to the figures. In that regard, FIG. 1 is a flowchart illustrating a method 100 of forming contact structures according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-14, which are fragmentary cross-sectional views of a workpiece 200 at different stages of fabrication according to embodiments of the method 100 in FIG. 1. For avoidance of doubts, the X, Y and Z directions in FIGS. 2-14 are perpendicular to one another and are used consistently throughout FIGS. 2-14. Because the workpiece 200 will be fabricated into a semiconductor device or a semiconductor structure, the workpiece 200 may be referred to herein as a semiconductor device 200 or a semiconductor structure 200 as the context requires. Throughout the present disclosure, like reference numerals denote like features unless otherwise excepted.

Figure 2:
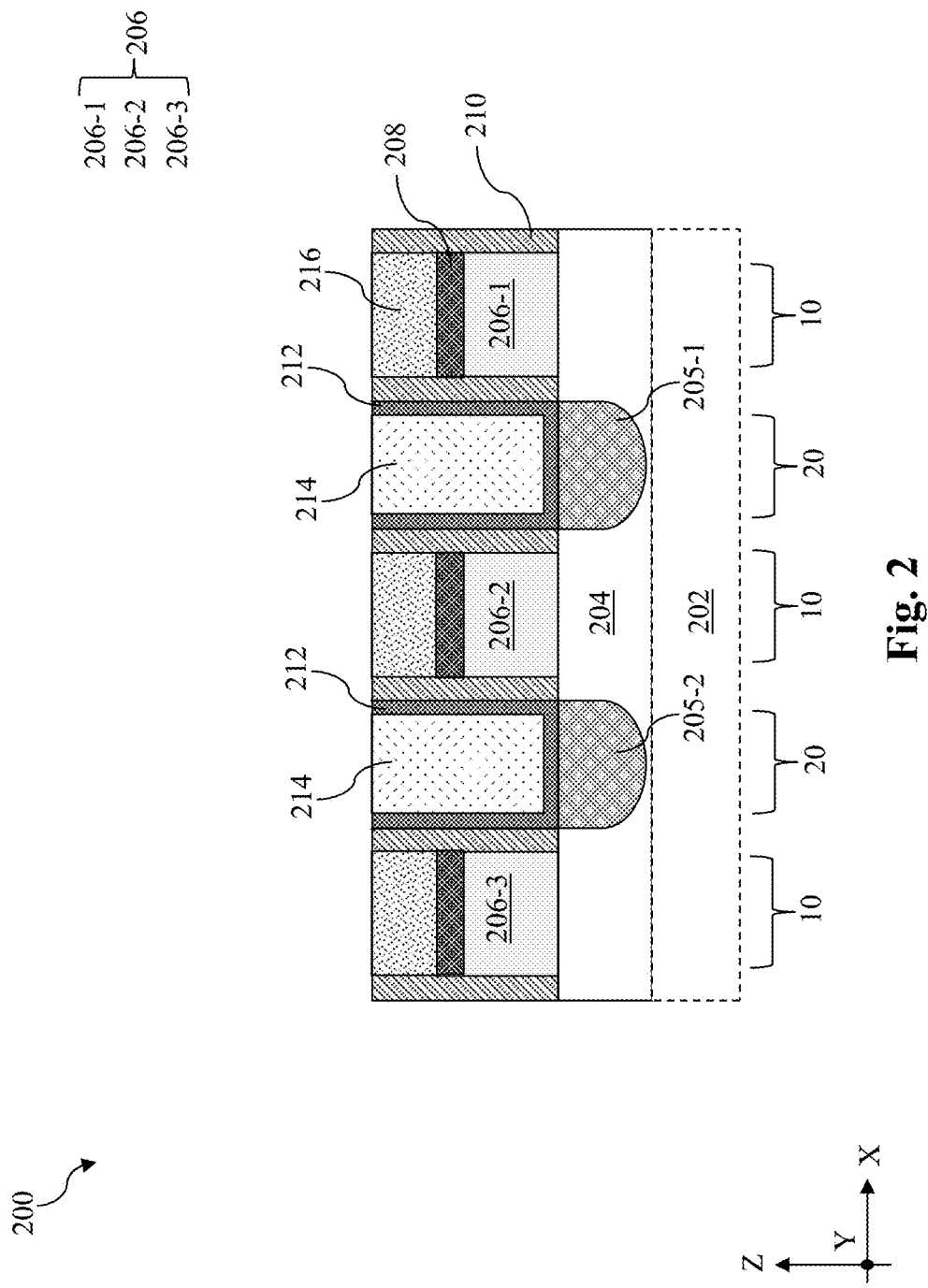
FIGS. 2-14 are fragmentary cross-sectional views of a workpiece at various stages of fabrication of the method in FIG. 1, according to various aspects of the present disclosure.

Referring to FIGS. 1 and 2, method 100 includes a block 102 where a workpiece 200 is received. The workpiece 200 includes a substrate 202. In the depicted embodiment, substrate 202 includes silicon (Si). Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, substrate 202 includes one or more group III-V materials, one or more group II-VI materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), boron difluoride ($BF_2$), other p-type dopant, or combinations thereof. N-type doped regions (for example, n-type wells) include n-type dopants, such as phosphorus (P), arsenic (As), other n-type dopant, or combinations thereof. An ion implantation process, a diffusion process, and/or other suitable doping process can be performed to form the various doped regions. The substrate 202 is shown in dotted lines in FIG. 2 and is omitted from FIGS. 3-14 for simplicity.

As shown in FIG. 2, the workpiece 200 includes an active region 204 of a multi-gate device, such as a fin-type field effect transistors (FinFET) or a multi-bridge-channel (MBC) transistor. When the active region 204 is for a FinFET, the active region 204 may be a fin element (or fin structure) that extends lengthwise along the X. When the active region 204 is for an MBC transistor, the active region may be a vertical stack of channel members, each of which extends lengthwise along the X direction. Because a gate structure of an MBC transistor wraps around each of the channel regions, an MBC transistor may also be referred to as a surrounding gate transistor (SGT) or a gate-all-around (GAA) transistor. The channel members come in forms of nanostructures, such as nanosheets, nanowires, or nanorods. The active region 204 may be formed from patterning the substrate 202 or one or more epitaxial layers deposited over the substrate 202. In the depicted embodiment, the active region 204 is formed from patterning a portion of the substrate 202 and includes silicon (Si). Although not explicitly shown in the figures, an isolation feature may be formed between the active region 204 and adjacent active regions (not explicitly shown). In some embodiments, the isolation feature may include silicon oxide, silicon nitride, silicon oxynitride, fluorine-doped silicate glass (FSG), a low-k dielectric, combinations thereof, and/or other suitable materials.

As shown in FIG. 2, the workpiece 200 further includes a first gate structure 206-1, a second gate structure 206-2, and a third gate structure 206-3 that are disposed over channel regions 10 of the active region 204. For ease of references, the first gate structure 206-1, the second gate structure 206-2, and the third gate structure 206-3 may be collectively referred to as gate structures 206. The channel regions 10 of the active region 204 are interleaved by source/drain regions 20. Each of the channel regions 10 interposes two source/drain regions 20. The gate structures 206 wrap over channel regions 10 of the active region 204. When the active region 204 includes a vertical stack of channel members, the gate structures 206 wraps around each of the channel members. While not explicitly shown in the figures, each of the gate structures 206 includes a gate dielectric layer and a gate electrode over the gate dielectric. The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide ($k \approx 3.9$). Exemplary high-k dielectric materials for the high-k dielectric layer include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. In one embodiment, the high-k dielectric layer is formed of hafnium oxide (HfO). The gate electrode may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof. The metal fill layer may be omitted when the work function materials take up all of the gate openings.

Sidewalls of each of the gate structures 206 are lined by a gate spacer 210. The gate spacer 210 may be a single layer or a multi-layer. In some embodiments, the gate spacer 210 may include silicon carbonitride, silicon oxycarbide, silicon oxycarbonitride, or silicon nitride. In some embodiments, a gate replacement or a gate last process may be used to form the gate structures 206. In an example gate last process, dummy gate stacks are formed over channel regions 10 of the active region 204. The gate spacer 210 is then deposited over the workpiece 200, including over sidewalls of the dummy gate stacks. An anisotropic etch process is then performed to recess the source/drain regions 20 to form source/drain trenches, leaving behind the gate spacer 210 extending along sidewalls of the dummy gate stacks. After formation of the source/drain trenches, a first source/drain feature 205-1 and a second source/drain feature 205-2 are deposited into the source/drain trenches in the source/drain regions 20. The first source/drain feature 205-1 and the second source/drain feature 205-2 may be formed vapor-phase epitaxy (VPE), ultra-high vacuum CVD (UHV-CVD), LPCVD, and/or PECVD, molecular beam epitaxy (MBE), or other suitable epitaxy processes, or combinations thereof. The source/drain features may also be referred to as epitaxial features. Depending on the design of the semiconductor device 200, the first source/drain feature 205-1 and the second source/drain feature 205-2 may be n-type or p-type. When they are n-type, they may include silicon (Si) doped with an n-type dopant, such as phosphorus (P) or arsenic (As). When they are p-type, they may include silicon germanium (SiGe) doped with a p-type dopant, such as boron (B) or boron difluoride (BF2). In some implementations, annealing processes may be performed to activate dopants in the first source/drain feature 205-1 and the second source/drain feature 205-2. In the depicted embodiments, the first source/drain feature 205-1 and the second source/drain feature 205-2 may include phosphorus-doped silicon (Si:P) or boron-doped silicon germanium (SiGe:B).

After the formation of the source/drain features (such as the first source/drain feature 205-1 and the second source/drain feature 205-2), a contact etch stop layer (CESL) 212 and a first interlayer dielectric (ILD) layer 214 are deposited over the workpiece 200. In some embodiments, the CESL 212 may include silicon nitride, silicon oxynitride, and/or other materials known in the art. The CESL 212 may be deposited using atomic layer deposition (ALD), plasma-enhanced ALD (PEALD), plasma-enhanced chemical vapor deposition (PECVD), and/or other suitable deposition processes. The first ILD layer 214 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 214 may be deposited over the CESL 212 by CVD, flowable CVD (FCVD), spin-on coating, or other suitable deposition technique. The workpiece 200 is then planarized using a chemical mechanical polishing (CMP) process to expose the dummy gate stacks. The dummy gate stacks are then removed and replaced with the gate structures 206, the composition of which is described above.

The gate structures 206 are capped by a cap layer 208. In some embodiments, the cap layer 208 may include fluorine-free tungsten (FFW) that is deposited using chemical vapor deposition (CVD) or metal organic chemical vapor deposition (MOCVD). As shown in FIG. 2, the workpiece 200 may also include a self-aligned capping (SAC) layer 216 over the cap layer 208. In some embodiments, the SAC layer 216 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. The SAC layer 216 may be deposited using CVD, ALD, PEALD, or a suitable method.

Figure 3:
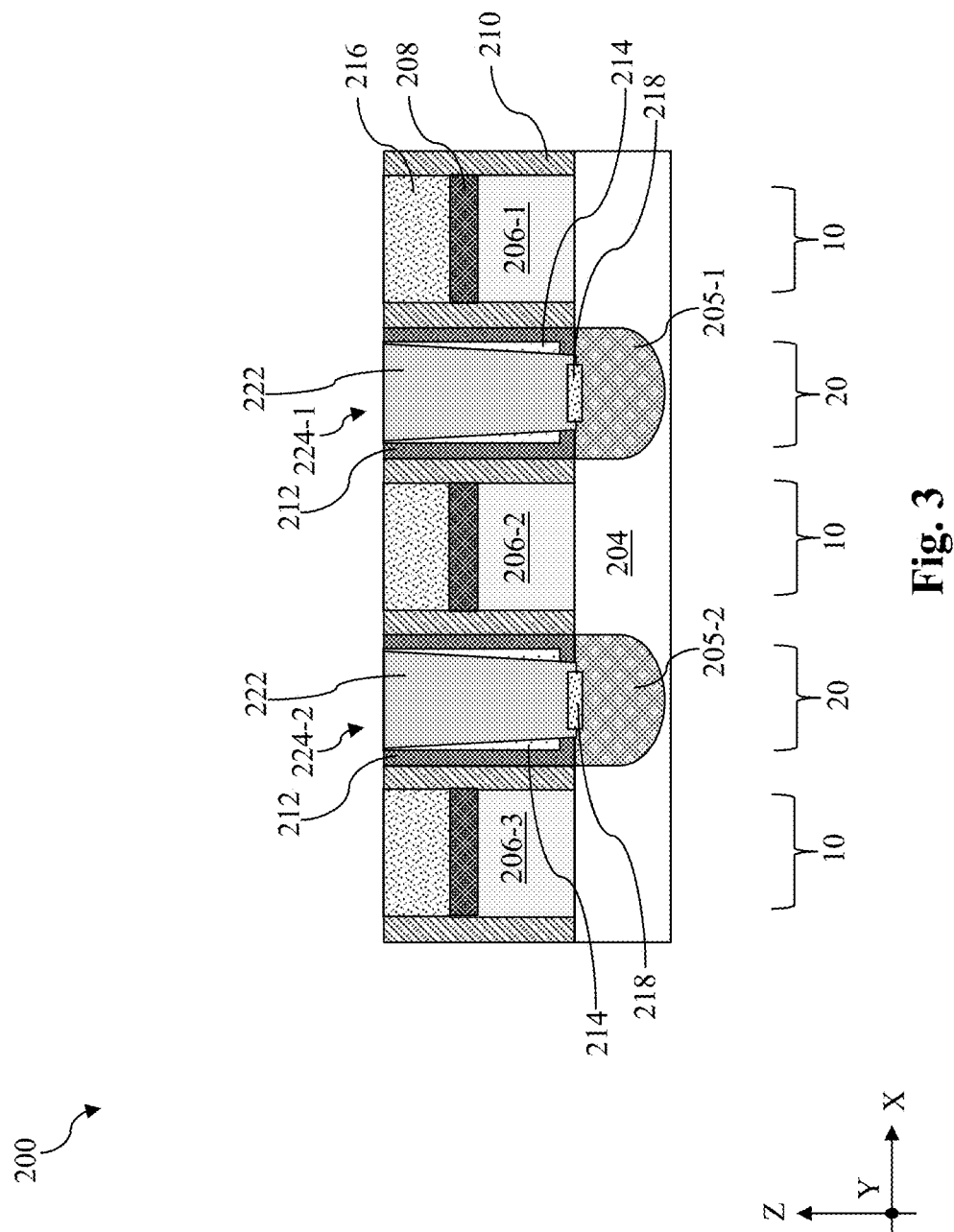

Referring now to FIGS. 1 and 3, method 100 includes a block 104 where a first source/drain contact 224-1 is formed to couple to the first source/drain feature 205-1 and a second source/drain contact 224-2 is formed to couple to the second source/drain feature 205-2. Block 104 includes formation of source/drain contact openings over the source/drain regions 20 through the first ILD layer 214 and the CESL 212 and formation of the first source/drain contact 224-1 and the second source/drain contact 224-2 in the source/drain contact openings. The formation of the source/drain contact opening may include use of lithography processes and/or etching processes. In some implementations, the lithography processes include forming a resist layer over the workpiece 200, exposing the resist layer to pattern radiation, and developing the exposed resist layer, thereby forming a patterned resist layer. The workpiece 200 is then subject to a dry etch process using the patterned resist layer as a masking element to expose a portion of the first source/drain feature 205-1 and a portion of the second source/drain feature 205-2. The dry etch process at block 104 may include use of a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a hydrocarbon species (e.g. $CH_4$), a bromine-containing gas (e.g., HBr and/or $CHBr_3$), an iodine-containing gas, other suitable gases and/or plasmas, and/or combinations thereof. After the formation of the source/drain contact opening, a silicide layer 218 is formed in the source/drain contact openings. In some instances, the silicide layer 218 may include titanium silicide, cobalt silicide, nickel silicide, tantalum silicide, or tungsten silicide. Thereafter, a metal fill layer 222 is deposited using a bottom-up selective CVD over the silicide layer 218 to form the first source/drain contact 224-1 over the first source/drain feature 205-1 and the second source/drain contact 224-2 over the second source/drain feature 205-2. It is noted that, because of the use of the bottom-up selective CVD, no barrier layer is deposited before the deposition of the metal fill layer 222. Bottom-up selective CVD provides a metal-on-metal, selective deposition of metal that has a slower deposition rate of regular CVD. The metal fill layer 222 may include ruthenium (Ru), cobalt (Co), nickel (Ni), or copper (Co). In the depicted embodiment, the metal fill layer 222 includes cobalt (Co). After the deposition of the metal fill layer 222, a chemical mechanical polishing (CMP) process may be performed to remove excess materials and define the final shape of the first source/drain contact 224-1 and the second source/drain contact 224-2. After the CMP process, a top surface of the workpiece 200 is substantially planar.

Figure 4:
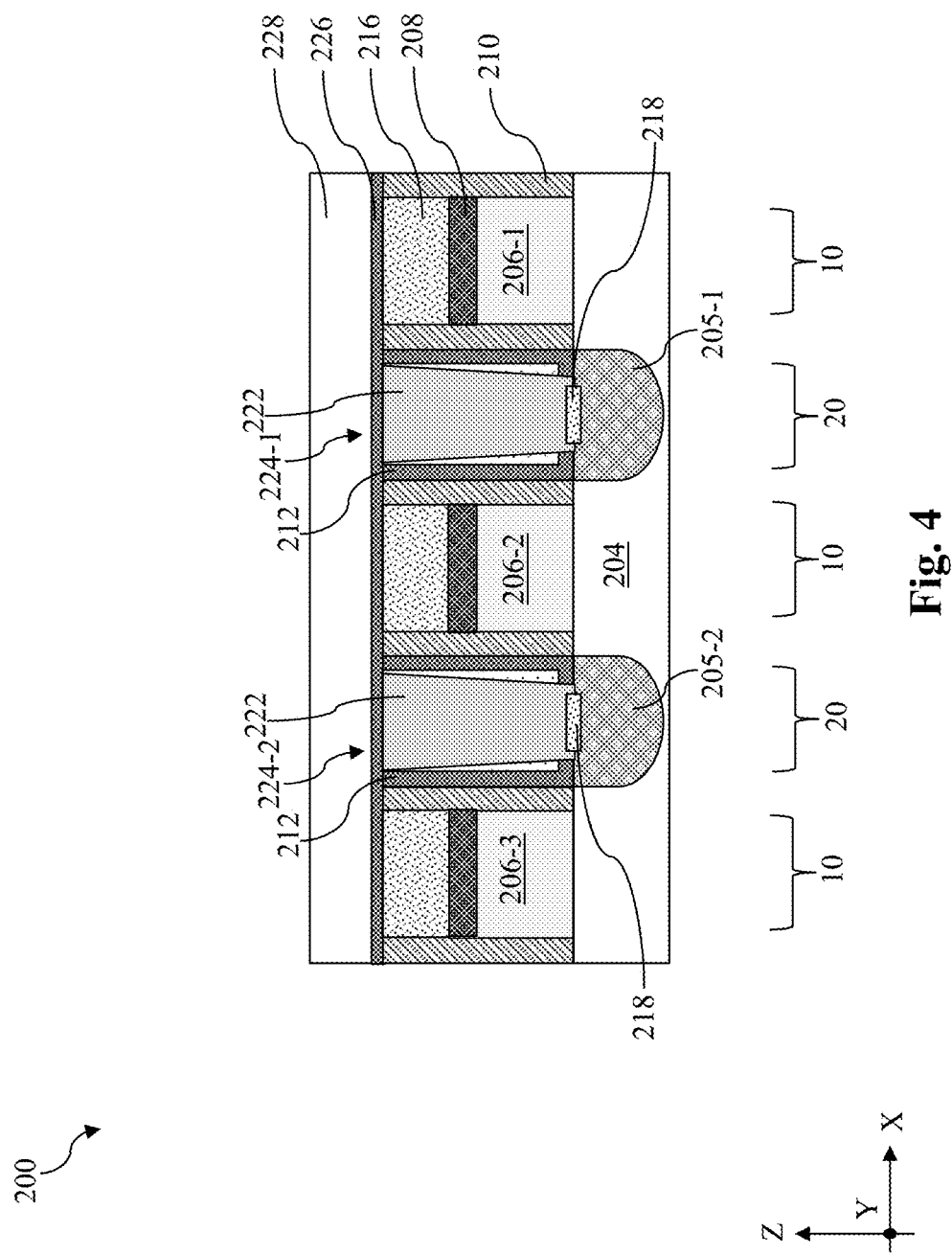

Referring now to FIGS. 1 and 4, the method 100 includes a block 106 where a middle etch stop layer (MESL) 226 and a second interlayer dielectric (ILD) layer 228 are deposited over the workpiece 200. At block 106, the MESL 226 and the second interlayer dielectric (ILD) layer 228 are sequentially deposited over the workpiece 200. In some embodiments, the composition and formation process of the MESL 226 may be similar to those of the CESL 212 and the composition and formation process of the second ILD layer 228 may be similar to those of the first ILD layer 214.

Figure 5:
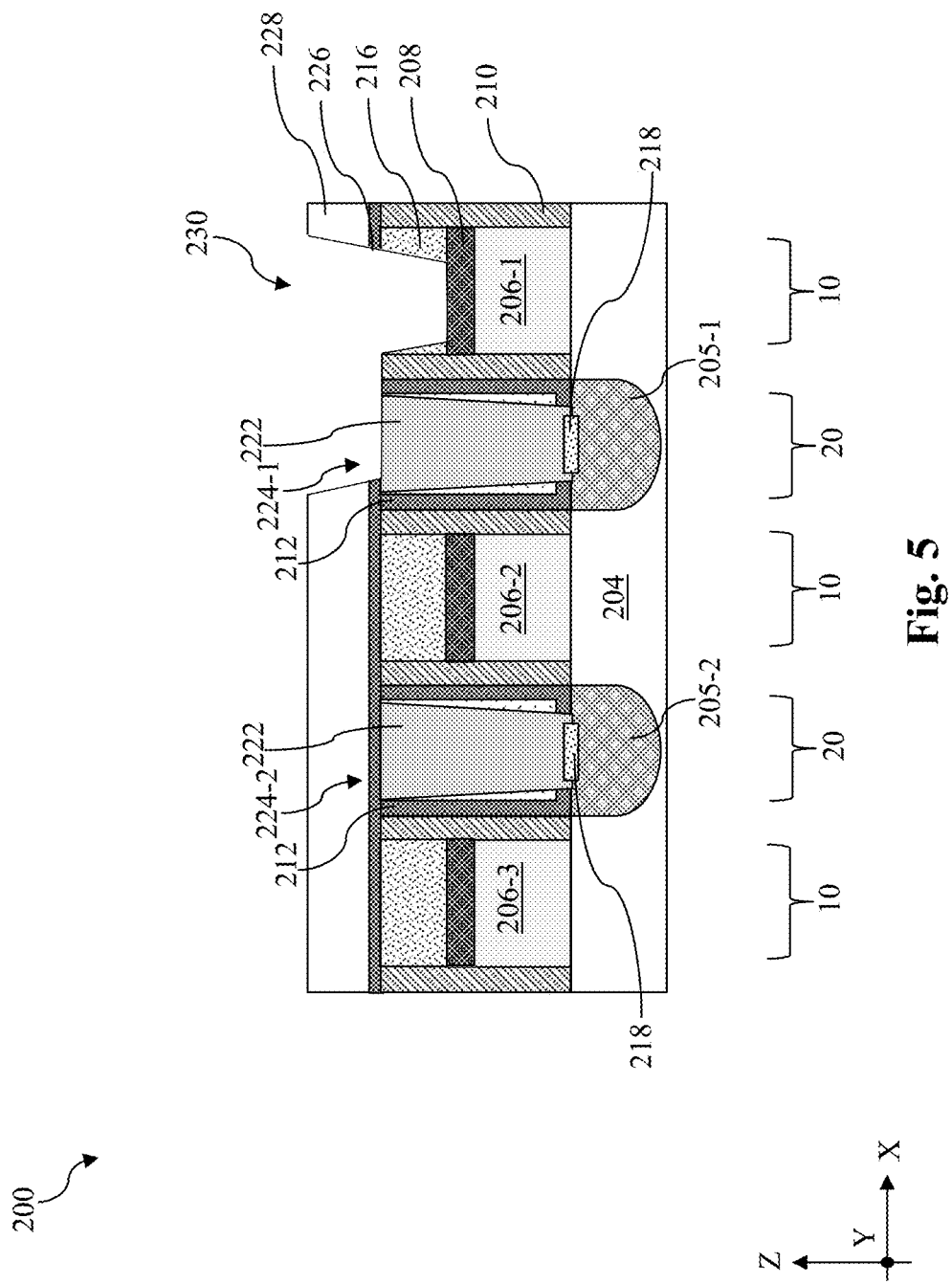

Referring to FIGS. 1 and 5, method 100 includes a block 108 where a butted contact opening 230 is formed to expose a cap layer 208 over the first gate structure 206-1 and the first source/drain contact 224-1. In an example process, a patterned photoresist layer may be formed over the workpiece 200 to expose the area directly over the first gate structure 206-1 and the first source/drain contact 224-1. The workpiece 200 is then anisotropically etched using the patterned photoresist layer as an etch mask. Because the anisotropic etch at block 108 is selective to the second ILD layer 228, the MESL 226, and the SAC layer 216, the end point of the butted contact opening 230 may fall on a top surface of the first source/drain contact 224-1 and a top surface of the cap layer 208 over the first gate structure 206-1. As a result, the butted contact opening 230 illustrated in FIG. 5 is formed. The butted contact opening 230 exposes not only the first source/drain contact 224-1 but also the cap layer 208 over the first gate structure 206-1. The anisotropic etch process at block 108 may be a dry etch that uses oxygen ($O_2$), nitrogen ($N_2$), a fluorine-containing gas (e.g., $CF_4$, $SF_6$, $NF_3$, $BF_3$, $CH_2F_2$, $CHF_3$, and/or $C_2F_6$), a chlorine-containing gas (e.g., $Cl_2$, $CHCl_3$, $CCl_4$, and/or $BCl_3$), a hydrocarbon species (e.g. $CH_4$), a bromine-containing gas (e.g., HBr and/or $CHBr_3$), an iodine-containing gas, other suitable gases and/or plasmas, and/or combinations thereof. In some embodiments, after the formation of the butted contact opening 230, a pre-clean process may be performed to remove oxide from the first source/drain contact 224-1 and the cap layer 208.

Figure 6:
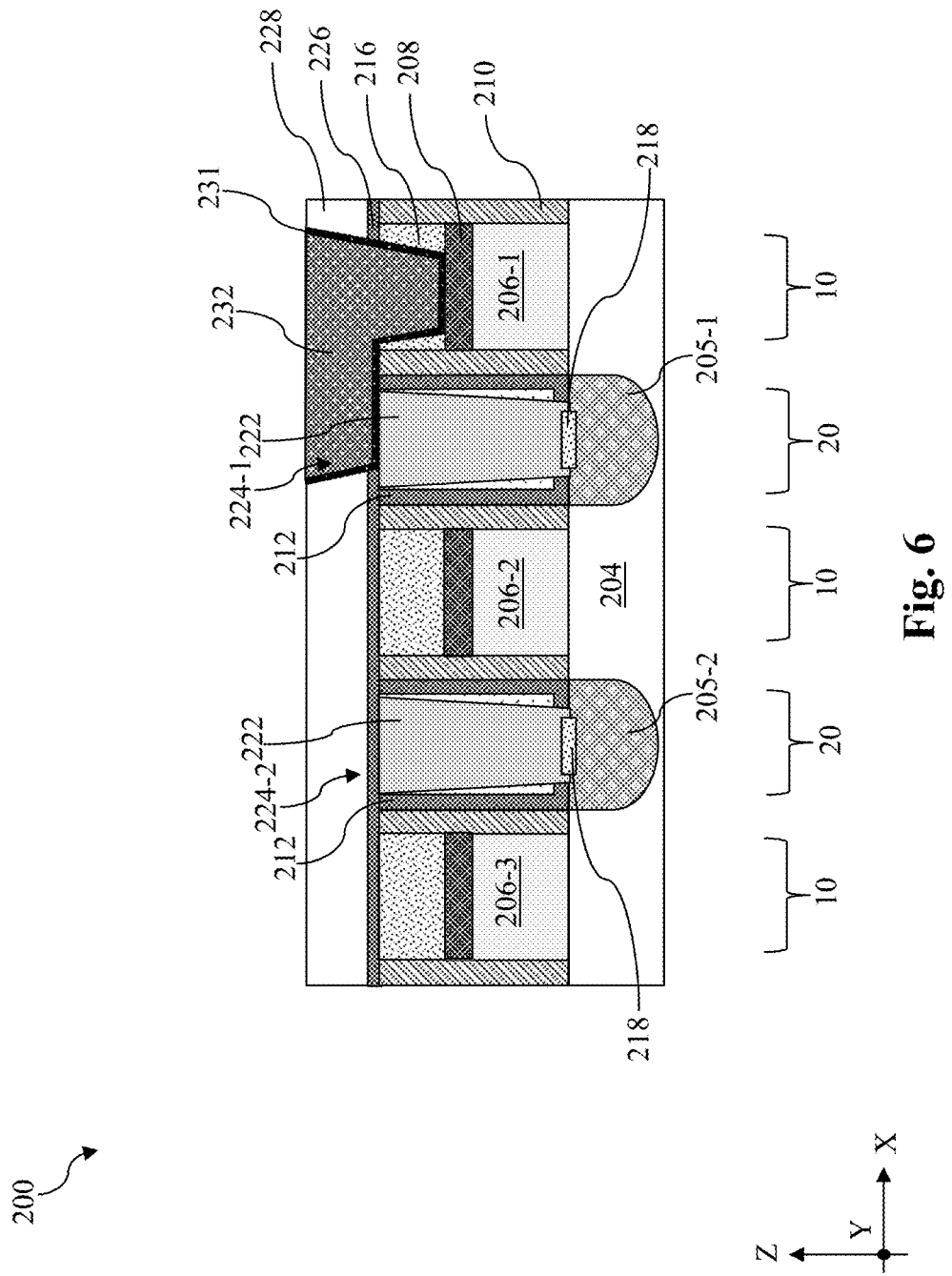

Referring to FIGS. 1 and 6, method 100 includes a block 110 where a butted contact 232 is formed in the butted contact opening 230. Operations at block 110 include deposition of a barrier layer 231 and a metal fill layer into the butted contact opening 230 and planarization of the workpiece 200 to remove excess metal material. At block 110, the barrier layer 231 may be deposited using physical vapor deposition (PVD) and a metal fill layer may be deposited over the barrier layer 231 using chemical vapor deposition (CVD). In some embodiments, the barrier layer 231 may include a metal nitride, such as titanium nitride (TiN) and the metal fill layer over the barrier layer 231 may include tungsten (W). It is noted that the deposition process of the butted contact 232 is different from the deposition of the source/drain contact. As described above, the source/drain contacts (such as the first source/drain contact 224-1) are deposited using bottom-up selective CVD and are barrier-free, while the butted contact 232 is deposited using CVD and includes the barrier layer 231. After the deposition of the metal material, the workpiece 200 is planarized by, for example, a CMP process until all metal material over the second ILD layer 228 is removed. After the planarization, the butted contact 232 is formed in the butted contact opening 230. The butted contact 232 (or the barrier layer 231 of the butted contact 232, to be precise) is in direct contact with the second ILD layer 228, the MESL 226, the metal fill layer 222 of the first source/drain contact 224-1, the gate spacer 210, the SAC layer 216, and the cap layer 208 over the first gate structure 206-1. Because the cap layer 208 is electrically conductive, the butted contact 232 that lands on the first source/drain contact 224-1 and the cap layer 208 is electrically coupled to the first source/drain contact 224-1 and the first gate structure 206-1.

Figure 7:
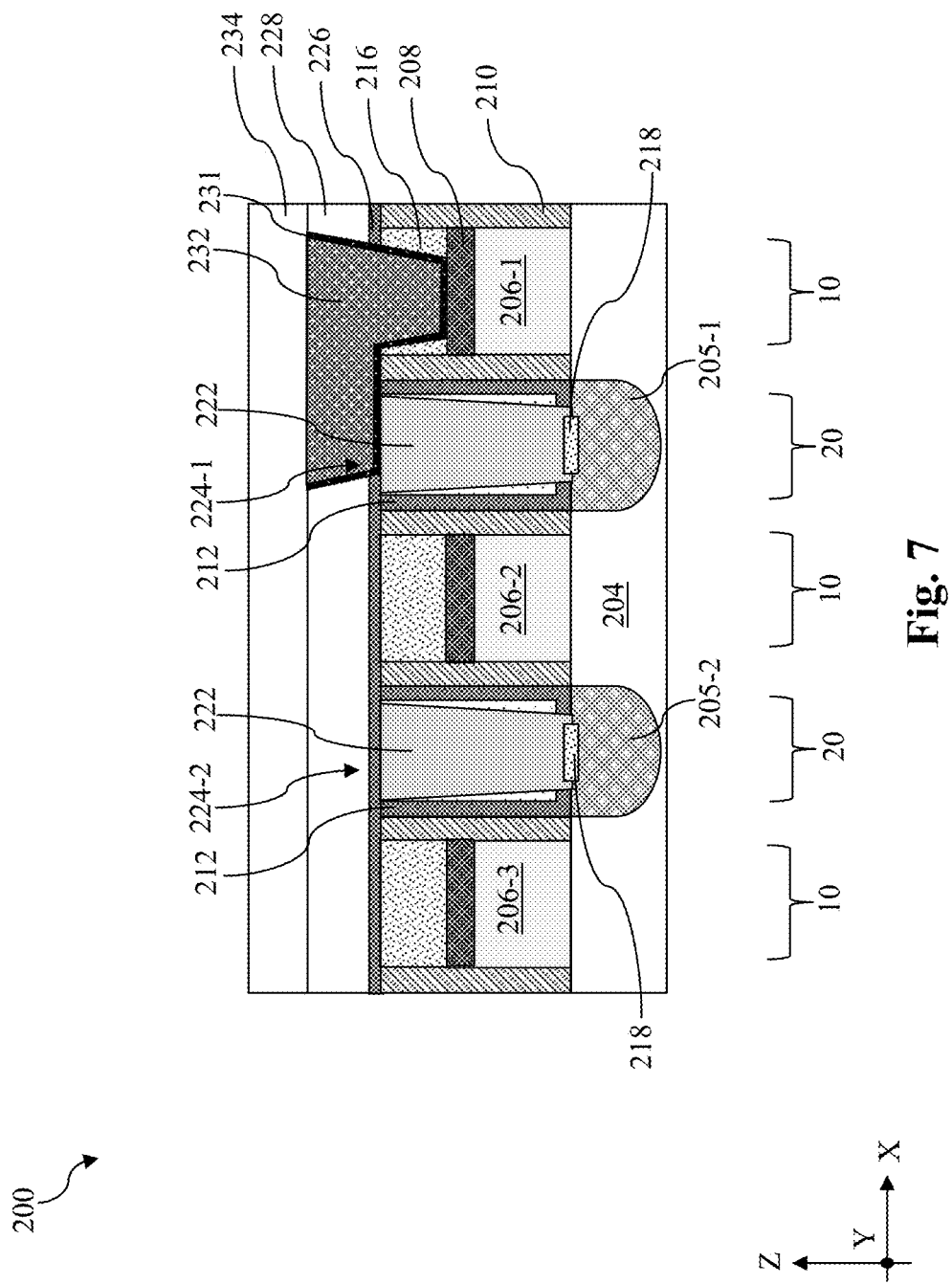

Referring to FIGS. 1 and 7, method 100 includes a block 112 where a third ILD layer 234 is deposited over the workpiece 200. Like the first ILD layer 214 and the second ILD layer 228, the third ILD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The third ILD layer 234 may be deposited over the second ILD layer 228 and the butted contact 232 by CVD, flowable CVD (FCVD), spin-on coating, or other suitable deposition technique.

Figure 8:
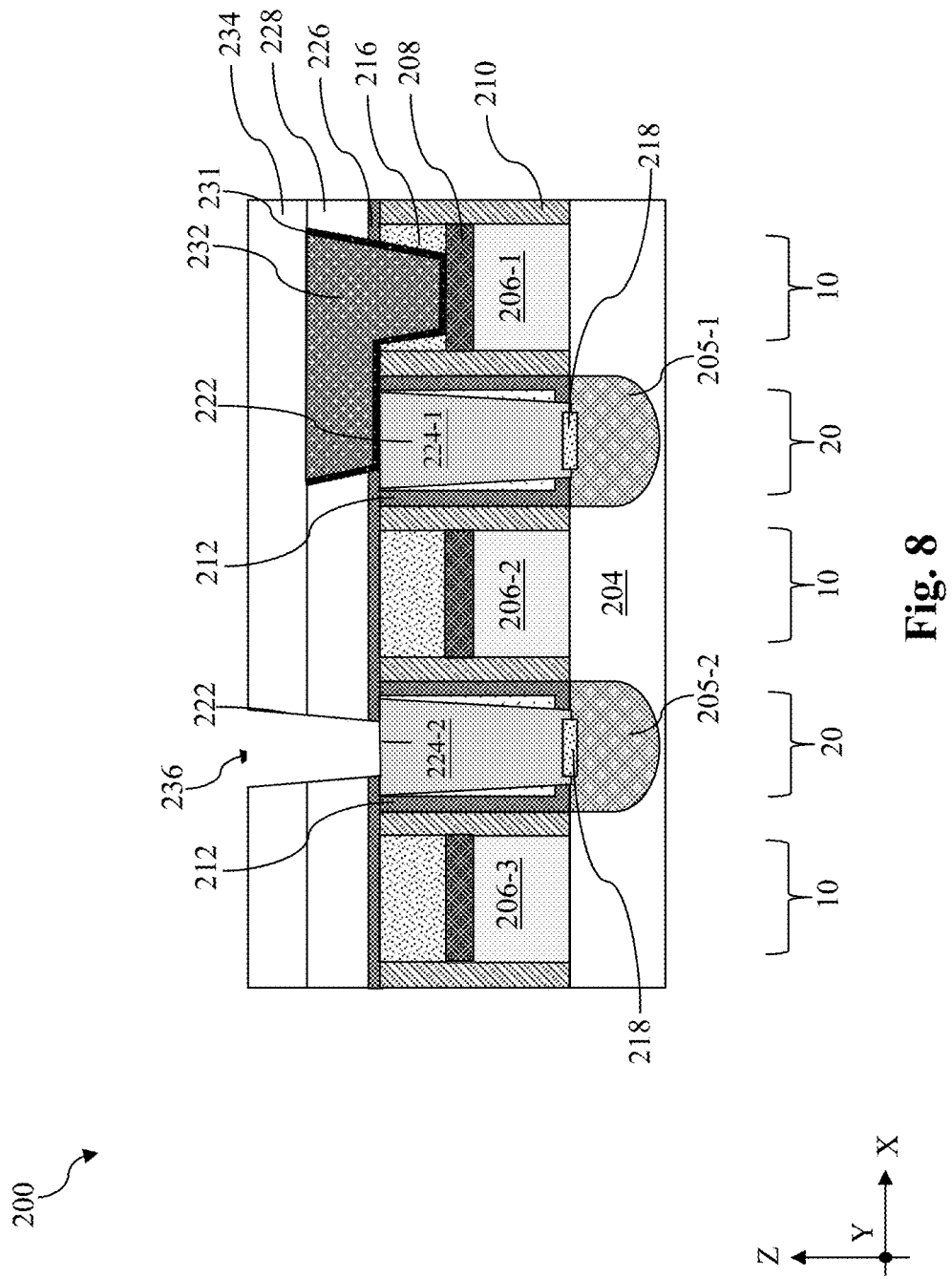

Referring to FIGS. 1 and 8, method 100 includes a block 114 where a source/drain contact via opening 236 is formed to expose the second source/drain contact 224-2. The formation of the source/drain contact via opening 236 may include photolithography processes and etch processes. The photolithography processes form an etch mask that includes an opening directly over the second source/drain contact 224-2. Referring to FIG. 8, a dry etch process is then performed to etch completely through the third ILD layer 234, the second ILD layer 228, and the MESL 226 to expose a top surface of the metal fill layer 222 of the second source/drain contact 224-2. An example dry etch process at block 114 may include use of oxygen ($O_2$), nitrogen ($N_2$), hydrogen ($H_2$), a fluorine-containing gas (e.g., $CF_4$, $SF_6$, $NF_3$, $BF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In one embodiment, the source/drain contact via opening 236 is etched using a nitrogen plasma, a hydrogen plasma, or both.

Figure 9:
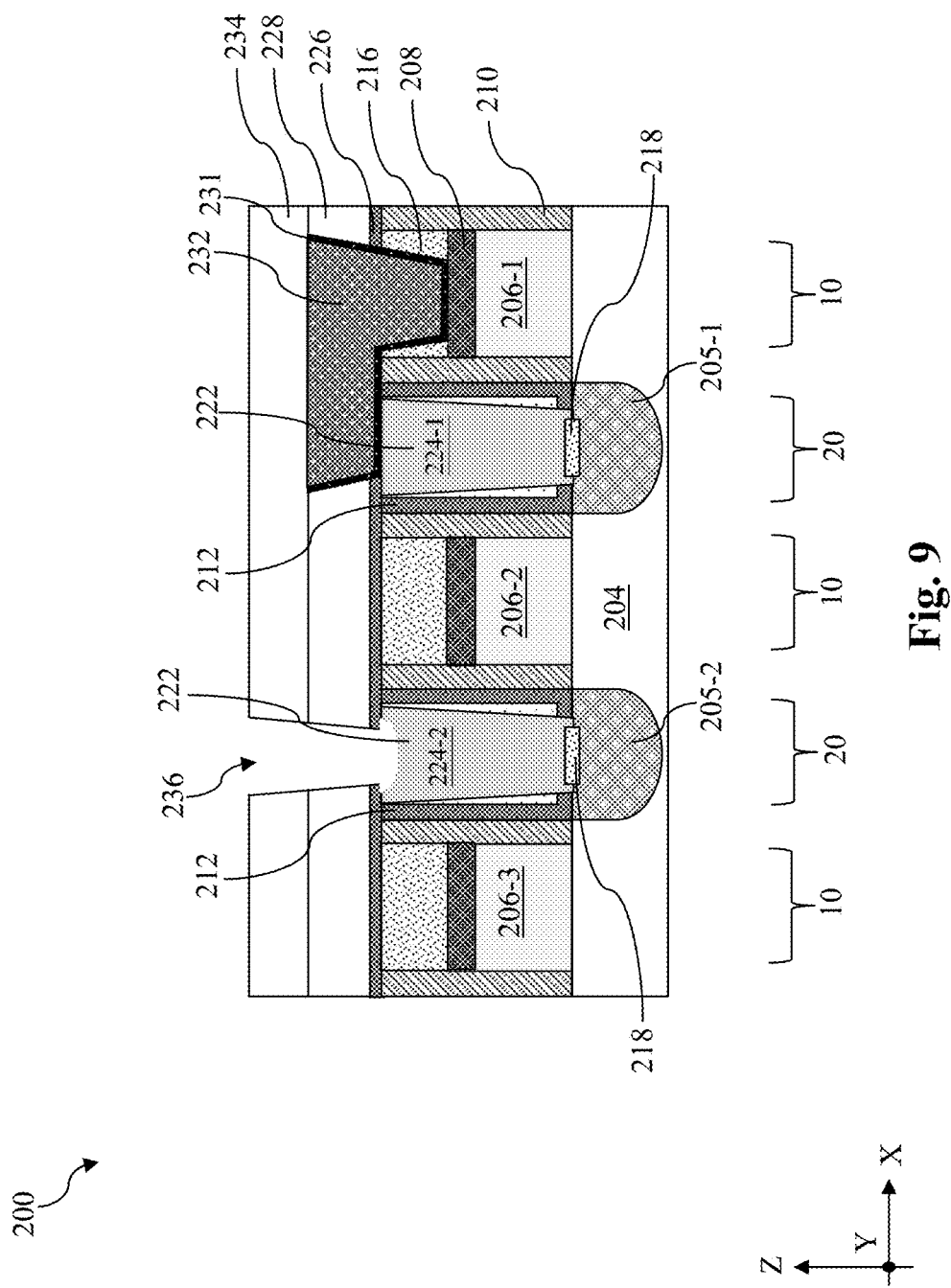

Referring to FIGS. 1 and 9, method 100 includes a block 116 where the second source/drain contact 224-2 is recessed. A selective wet etch process may be performed to selectively recess the metal fill layer 222 of the second source/drain contact 224-2 to extend the source/drain contact via opening 236 into the second source/drain contact 224-2. In some implementations, the selective wet etch process includes use of deionized (DI) water, nitric acid ($HNO_3$), hydrogen peroxide ($H_2O_2$), hydrochloride (HCl), or isopropyl alcohol (IPA). In one embodiment, the metal fill layer 222 is formed of cobalt (Co) and the recess at block 116 is performed using hydrogen peroxide ($H_2O_2$). As shown in FIG. 9, due to the isotropic nature of the wet etch process, a top surface of the metal fill layer 222 of the second source/drain contact 224-2 becomes concave or crater-like. In some embodiments represented in FIG. 9, after the recess, a portion of the source/drain contact via opening 236 may undercut the MESL 226 around the second source/drain contact 224-2. The recess at block 116 may improve adhesion and increase the interface surface area with the to-be-formed source/drain contact via 240 (to be described below).

Figure 10:
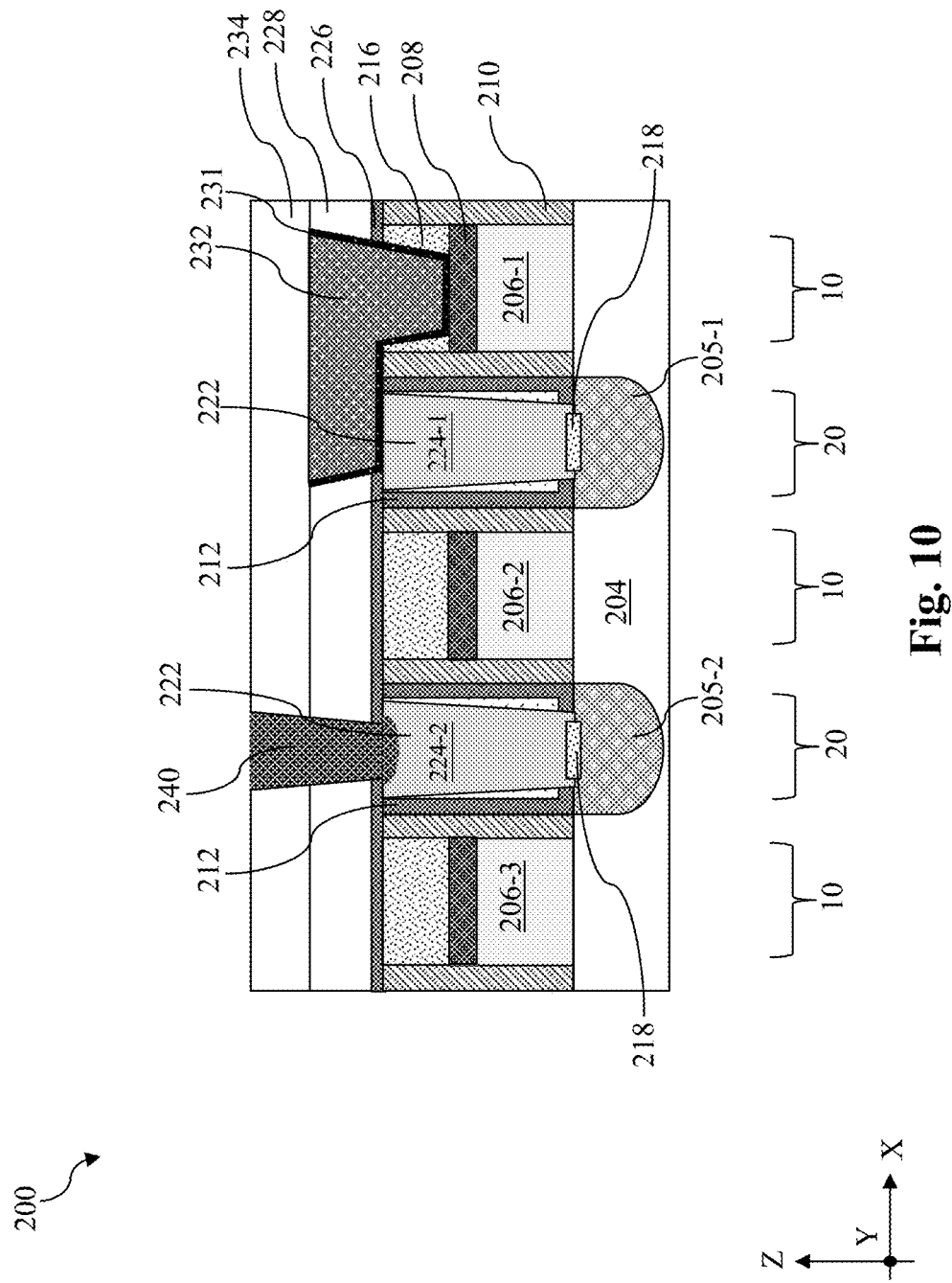

Referring to FIGS. 1 and 10, method 100 includes a block 118 where a source/drain contact via 240 is formed in the source/drain contact via opening 236. Operations at block 118 may include metal deposition and surface planarization. In an example process, a metal fill layer is deposited over the workpiece 200, including in the source/drain contact via opening 236. In some embodiments, the metal fill layer may include tungsten (W) or ruthenium (Ru). In the depicted embodiment, the metal fill layer includes tungsten (W). In some implementation, the metal fill layer may be deposited using bottom-up selective CVD or a suitable deposition technique. After the deposition of the metal fill layer, a CMP process is performed to planarize the workpiece 200 to remove excess materials and to form the source/drain contact via 240. As shown in FIG. 10, the source/drain contact via 240 extends through the third ILD layer 234, the second ILD layer 228, and MESL 226. Due to the recess process at block 116, the source/drain contact via 240 partially extends into the metal fill layer 222 of the second source/drain contact 224-2 and may undercut the MESL 226 around edges of the second source/drain contact 224-2. In some embodiments represented in FIG. 10, a top surface of the source/drain contact via 240 is higher than a top surface of the butted contact 232 by a difference substantially equal to a thickness of the third ILD layer 234.

Figure 11:
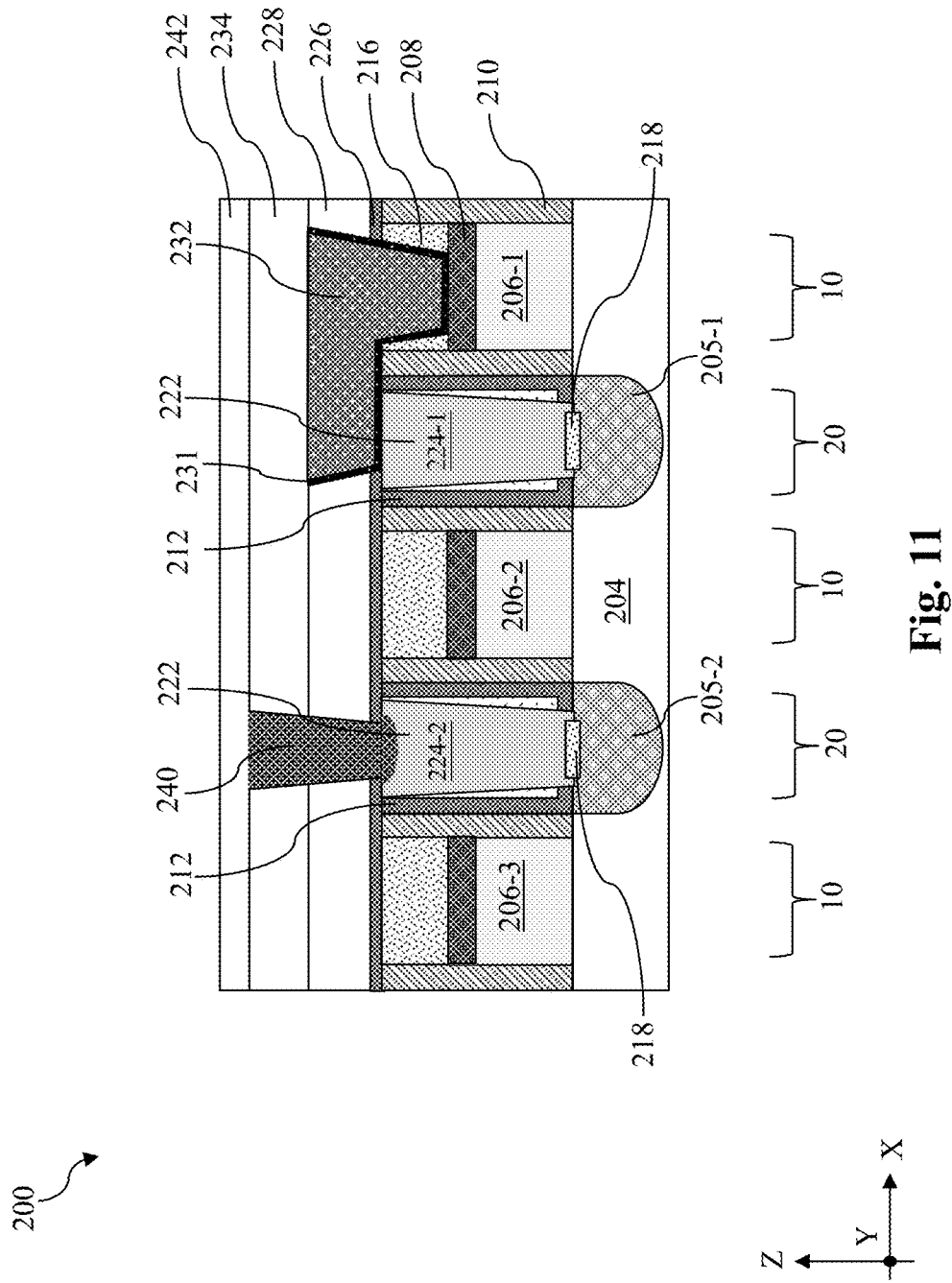

Referring to FIGS. 1 and 11, method 100 includes a block 120 where a fourth dielectric layer 242 is deposited over the workpiece 200. Like the first ILD layer 214 and the second ILD layer 228, the fourth ILD layer 242 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The fourth ILD layer 242 may be deposited over the third ILD layer 234 and a top surface of the source/drain contact via 240 by CVD, flowable CVD (FCVD), spin-on coating, or other suitable deposition technique.

Figure 12:
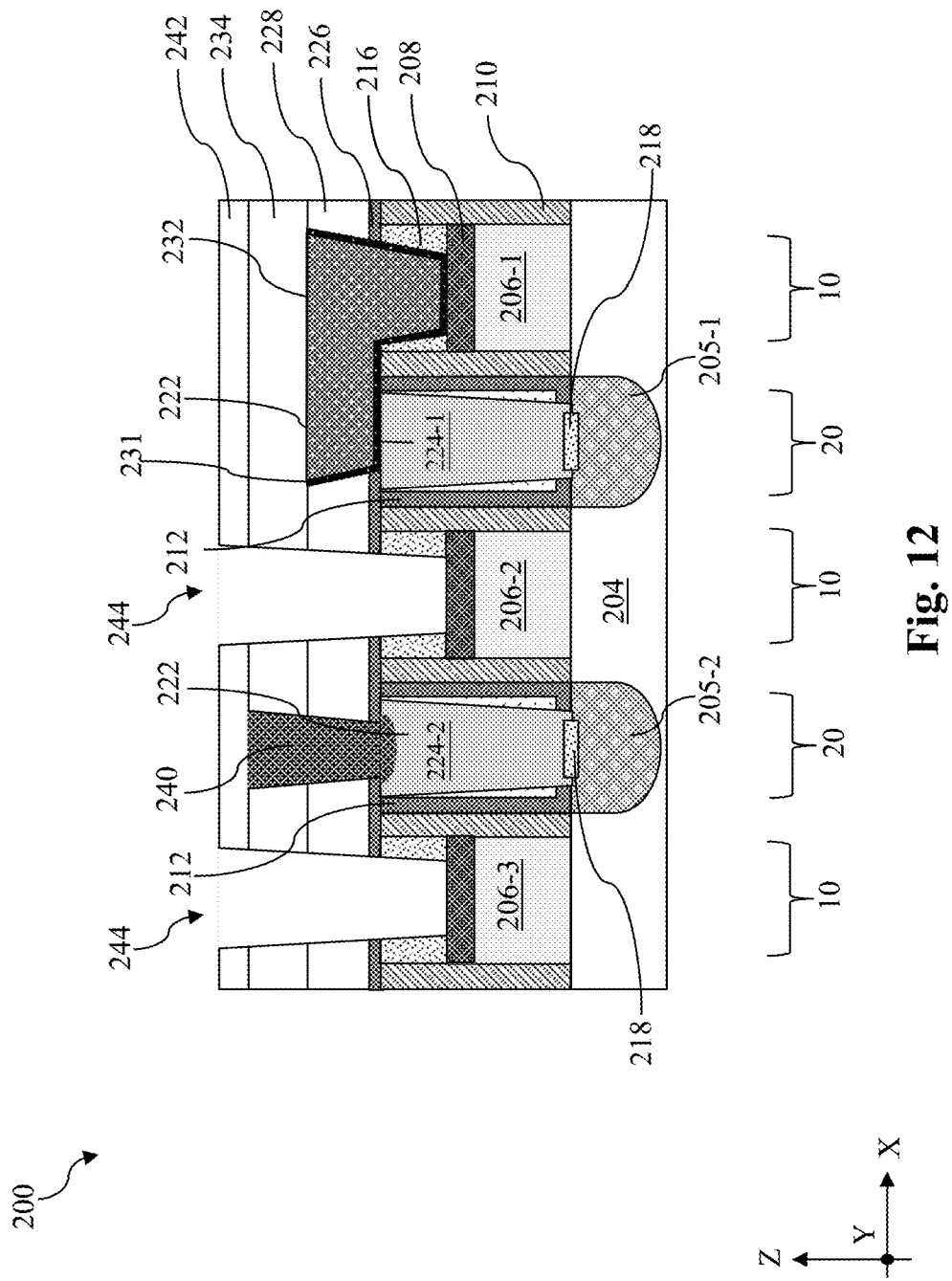

Referring to FIGS. 1 and 12, method 100 includes a block 122 where a gate contact opening 244 is formed to expose the cap layer 208 on the second gate structure 206-2. Formation of the gate contact openings 244 through the fourth ILD layer 242, the third ILD layer 234, the second ILD layer 228, the MESL 226, and the SAC layer 216 over the second gate structure 206-2 or the third gate structure 206-3 may include use of lithography processes and/or etching processes. The lithography processes include forming a resist layer over the fourth ILD layer 242, exposing the resist layer to pattern radiation, and developing the exposed resist layer, thereby forming a patterned resist layer. The workpiece 200 is then etched in a dry etch process using the patterned resist layer as an etch mask. An example dry etch process for block 122 may include use of oxygen (O$_2$), nitrogen (N$_2$), hydrogen (H$_2$), a fluorine-containing gas (e.g., CF$_4$, SF$_6$, NF$_3$, BF$_3$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, other suitable gases and/or plasmas, and/or combinations thereof. After the dry etch process, the patterned resist layer may be removed by ashing. A wet clean process may be performed to remove debris on the cap layer 208 over the second gate structure 206-2 and the third gate structure 206-3. In some implementations, the wet clean process may include use of deionized (DI) water or isopropyl alcohol (IPA).

Figure 13:
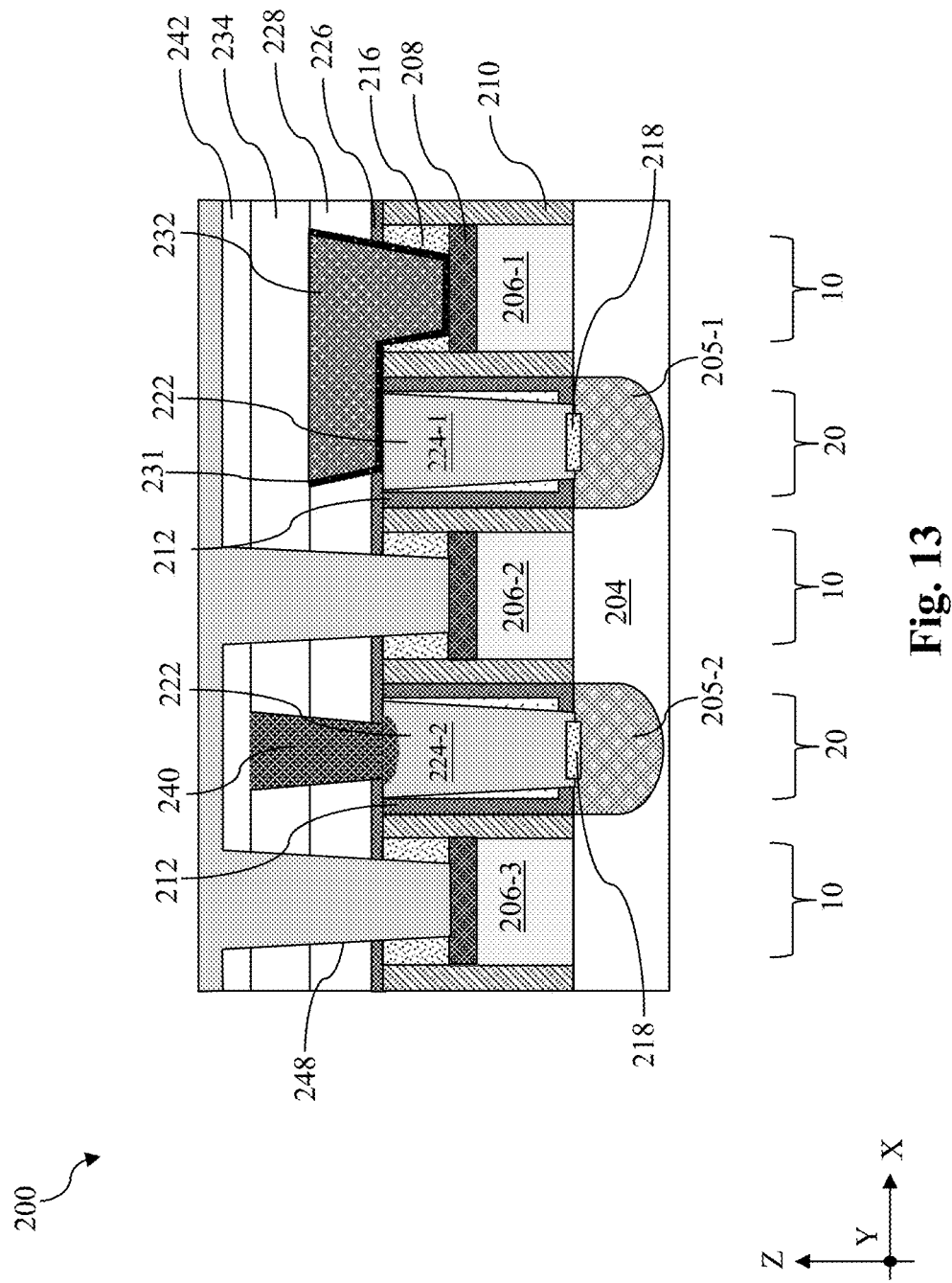
Figure 14:
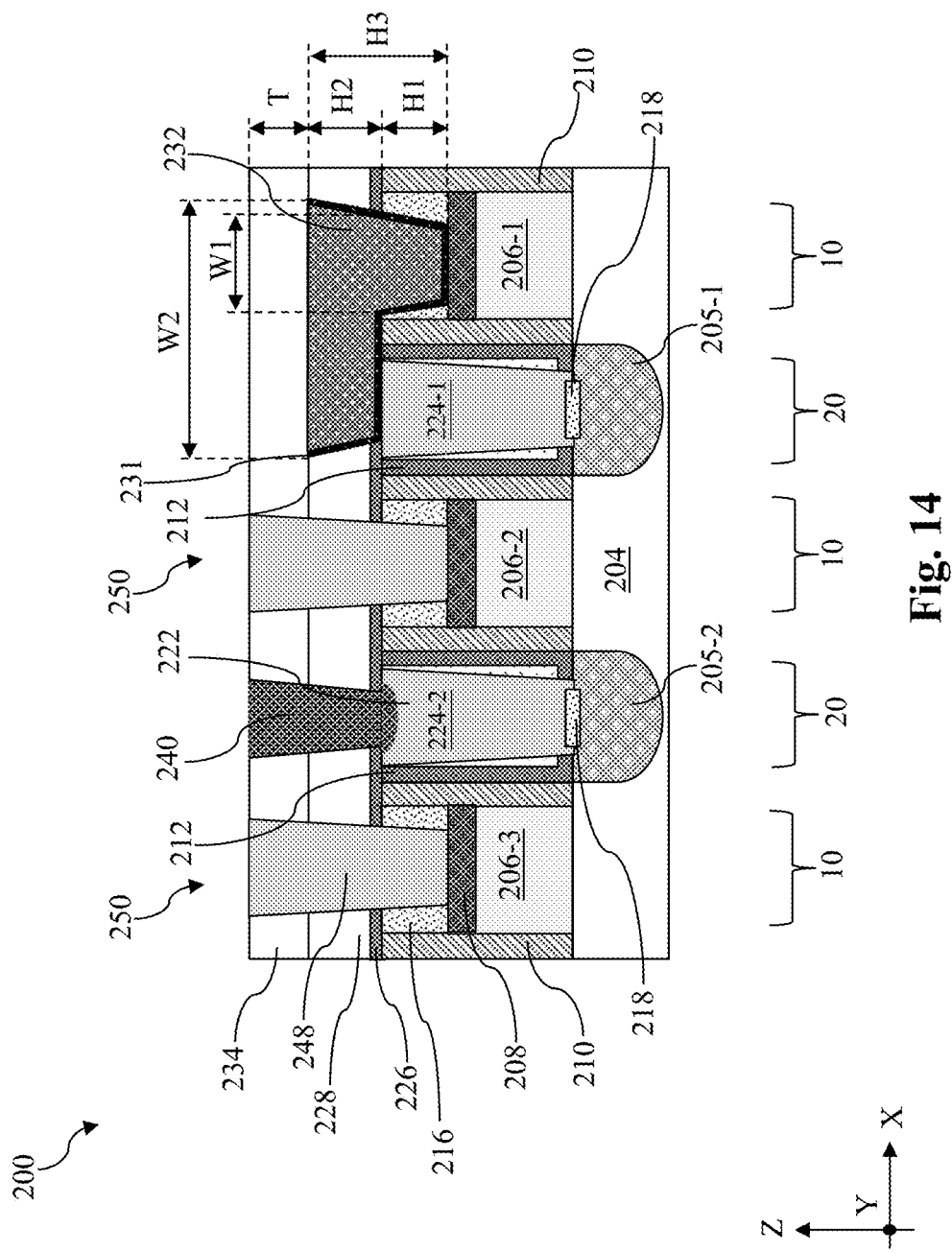

Referring to FIGS. 1, 13 and 14, method 100 includes a block 124 where a gate contact 250 is formed in the gate contact opening 244. The gate contact 250 may include a metal fill layer 248. The metal fill layer 248 for the gate contact 250 may include tungsten (W) or ruthenium (Ru) and may be deposited using bottom-up selective CVD. After the metal fill layer 248 is deposited over the workpiece 200 as shown in FIG. 13, the workpiece 200 is planarized in a CMP process to form the gate contacts 250 as shown in FIG. 14. The planarization at block 124 is performed until top surfaces of the gate contacts 250, the source/drain contact via 240, and the third ILD layer 234 are coplanar. Top surfaces of the gate contacts 250, the source/drain contact via 240, and the third ILD layer 234 are all higher than the top surface of the butted contact 232 by a thickness T of the third ILD layer 234. In some instances, the thickness T of the third ILD layer 234 in FIG. 14 may be between about 5 nm and about 45 nm. When the thickness of the third ILD layer 234 is greater than 45 nm, the aspect ratios of the gate contact openings 244 or the source/drain contact via openings 236 may be too large for satisfactory metal filling. When the thickness of the third ILD layer 234 is smaller than 5 nm, the butted contact 232 may not be sufficiently insulated from overlying metal lines or contact structures.

Reference is still made to FIG. 14. According to the present disclosure, the butted contact 232 includes a lower portion that extends into the SAC layer 216 over the first gate structure 206-1 and an upper portion disposed above the first source/drain contact 224-1 and the lower portion. The lower portion of the butted contact 232 is disposed between two adjacent gate spacers 210 and is in contact with the cap layer 208 on the first gate structure 206-1. The upper portion of the butted contact 232 is disposed in the MESL 226 and the second ILD layer 228. As shown in FIG. 14, along the Z direction perpendicular to the substrate 202 (shown in FIG. 2), the lower portion has a first height H1 and the upper portion has a second height H2. In the depicted embodiment, the first height H1 substantially corresponds to the thickness of the SAC layer 216 and falls in a range between about 10 nm and about 25 nm. When the thickness of the SAC layer 216 is greater than 25 nm, the additional etching required to breach the SAC layer 216 may punch through the first source/drain contact 224-1 when forming the butted contact opening 230. When the thickness of the SAC layer 216 is smaller than 10 nm, the butted contact opening 230 may expand laterally, leading to undesirable coupling to adjacent gate contacts. The second height H2 of the upper portion substantially corresponds to the total thickness of the MESL 226 and the second ILD layer 228 and may be between about 30 nm and about 40 nm. When the second height H2 is smaller than 30 nm, formation of the butted contact opening 230 may damage the first gate structure 206-1 and the cap layer 208. When the second height H2 is greater than 40, the butted contact opening 230 may not satisfactorily expose the cap layer 208 over the first gate structure 206-1. The butted contact 232 has a third height H3 that is the sum of the first height H1 of the lower portion and the second height H2 of the upper portion. In some instances, the third height H3 may be between about 40 nm and 60 nm. The lower portion has a first top opening width W1 along the X direction and the upper portion has a second opening width W2 along the X direction. In some instances, the first top opening width W1 may be between about 10 nm and about 25 nm and the second top opening width W2 may be between about 14 nm and about 40 nm. When the second top opening width W2 is smaller than 14 nm, the butted contact 232 may have a poor landing on the first source/drain contact 224-1. When the second top opening width W2 is greater than 40 nm, the butted contact 232 may come in contact with a neighboring gate contacts, resulting in undesirable electrical connection. As a whole, the butted contact 232 of the present disclosure has a nominal aspect ratio (i.e., the third height H3 divided by the second top opening width W2 or H3/W2) between about 0.9 and about 2. It can be seen that if a hypothetical butted contact also extends through the third ILD layer 234 with the thickness T, its aspect ratio would be calculated as a sum of the third height H3 and the thickness T, divided by the second opening width W2. Such a hypothetical butted contact would have a nominal aspect ratio between about 1.5 and 3, which would impede satisfactory metal filling in its lower portion and may result in voids and defects. Such voids and defects may increase the contact resistance.

Figure 15:
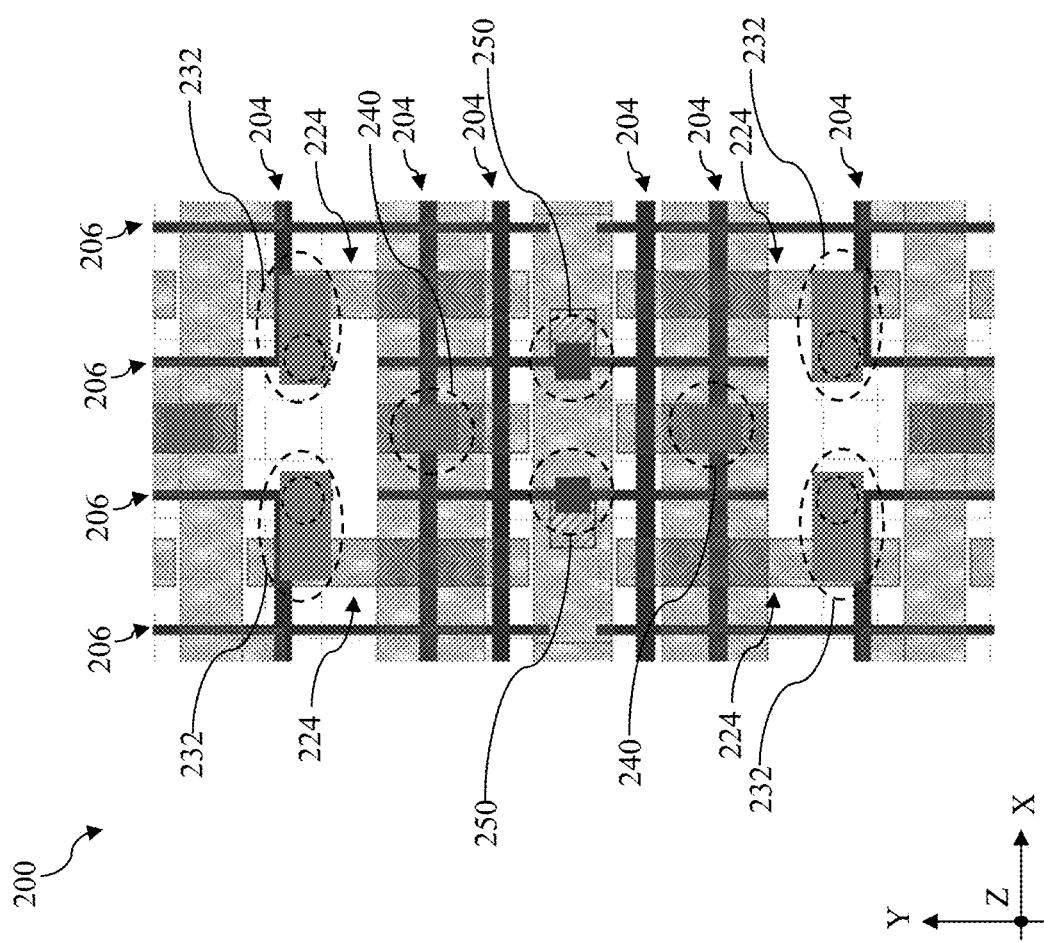
FIG. 15 is a fragmentary top view of a semiconductor device that includes gate contacts, source/drain contact vias, and butted contacts, according to various aspects of the present disclosure.

FIG. 14 depicts that the butted contact 232, the source/drain contact via 240, and the gate contacts 250 are shown along the same cross-section. In some embodiments, while the shapes, depths, and relative vertical positions may remain the same, the butted contact 232, the source/drain contact via 240, and the gate contacts 250 may not be on the same cross section. FIG. 15 provides an example where the butted contacts 232, the source/drain contact vias 240, and the gate contacts 250 of a semiconductor device 200 do not necessarily appear on a cross section. The semiconductor device 200 in FIG. 15 includes a plurality of gate structures 206 extending lengthwise along the Y direction, a plurality of active regions 204 extending lengthwise along the X direction, and a plurality of source/drain contacts 224 extending lengthwise along the Y direction. The semiconductor device 200 includes a plurality of butted contacts 232, a plurality of source/drain contact vias 240, and a plurality of gate contacts 250. Each of the butted contacts 232 spans over and is electrically coupled to a gate structure 206 and an adjacent source/drain contact 224. Each of the source/drain contact vias 240 is disposed directly on a source/drain contact 224. Each of the gate contacts 250 is disposed directly over and electrically coupled to a gate structure 206. As shown in FIG. 15, a cross-section that cuts across a butted contact 232 along the X direction does not cut through any of the source/drain contact vias 240 or any of the gate contacts 250.

The butted contact and methods of the present disclosure provide several benefits. For example, the butted contact opening that expose a gate structure and an adjacent source/drain contact is not as deep as the source/drain contact via opening or the gate contact opening. As such, the butted contact opening has a smaller aspect ratio that is conducive to satisfactory metal filling. The butted contact may be formed of tungsten (W) and may be deposited using a combination of PVD and CVD. The smaller aspect ratio and the two-stage metal filling improves the integrity of the butted contact and reduce contact resistance to the gate structure.

The present disclosure provides for many different embodiments. In one embodiment, a method is provided. The method includes receiving a workpiece that includes a first gate structure including a first cap layer thereon, a first source/drain contact adjacent the first gate structure, a second gate structure including a second cap layer thereon, a second source/drain contact, an etch stop layer (ESL) over the first source/drain contact and the second source/drain contact, and a first dielectric layer over the ESL. The method further includes forming a butted contact opening to expose the first cap layer and the first source/drain contact, forming a butted contact in the butted contact opening, after the forming of the butted contact, depositing a second dielectric layer, forming a source/drain contact via opening through the second dielectric layer, the ESL layer, and the first dielectric layer to expose the second source/drain contact, and forming a source/drain contact via in the source/drain contact via opening.

In some embodiments, the method may further include after the forming of the source/drain contact via, depositing a third dielectric layer over the source/drain contact via, forming a gate contact via opening to expose the second cap layer, and forming a gate contact via in the gate contact via opening. In some embodiments, the method may further include before the forming of the source/drain contact via, recessing the second source/drain contact. In some implementations, the recessing of the second source/drain contact includes use of hydrogen peroxide. In some instances, the first cap layer and the second cap layer include fluorine-free tungsten. In some embodiments, the first source/drain contact and the second source/drain contact include cobalt. In some embodiments, the forming of the butted contact includes depositing a barrier over the butted contact opening using physical vapor deposition (PVD) and depositing a metal fill layer over the barrier layer using chemical vapor deposition (CVD), and planarizing the deposited metal fill layer. In some embodiments, after the planarizing, a top surface of the butted contact is coplanar with a top surface of the first dielectric layer. In some implementations, the metal fill layer includes tungsten.

In another embodiment, a method is provided. The method includes receiving a workpiece that includes a first gate structure, a first source/drain contact adjacent the first gate structure, a second gate structure, a second source/drain contact, an etch stop layer (ESL) over the first source/drain contact and the second source/drain contact, and a first dielectric layer over the ESL. The method may further include forming a butted contact to couple to the first gate structure and the first source/drain contact, depositing a second dielectric layer over the first dielectric layer and the butted contact, forming a source/drain contact via through the second dielectric layer, the first dielectric layer, and the ESL layer to couple the second source/drain contact, depositing a third dielectric layer over the source/drain contact via and the second dielectric layer, and forming a gate contact through the third dielectric layer, the second dielectric layer, the first dielectric layer, and the ESL layer to couple the second gate structure.

In some embodiments, the method may further include after the forming of the gate contact, planarizing the workpiece until a top surface of the gate contact is coplanar with a top surface of the source/drain contact via. In some implementations, the workpiece may further include a first cap layer over the first gate structure, a second cap layer over the second gate structure, a first self-aligned capping (SAC) layer over the first cap layer, and a second SAC layer over the second cap layer. In some embodiments, a portion of the butted contact extends through the first SAC layer to land on the first cap layer. In some implementations, the gate contact extends through the second SAC layer to land on the second cap layer. In some embodiments, the forming of the butted contact includes forming a butted contact opening to expose a top surface of the first source/drain contact and the first cap layer, depositing a barrier layer over the butted contact opening using physical vapor deposition (PVD), depositing a metal fill layer over the barrier layer using chemical vapor deposition (CVD), and planarizing the deposited metal fill layer. In some embodiments, the metal fill layer includes tungsten.

In still another embodiment, a semiconductor structure is provided. The semiconductor structure includes a first gate structure comprising a first cap layer thereon, a first source/ drain contact adjacent the first gate structure, a second gate structure comprising a second cap layer thereon, a second source/drain contact, an etch stop layer (ESL) over the first source/drain contact and the second source/drain contact, a first dielectric layer over the ESL, a second dielectric layer over the first dielectric layer, a butted contact spanning over the first gate structure and the first source/drain contact, the butted contact being in contact with the first source/drain contact and the first cap layer, a source/drain contact via disposed over the second source/drain contact, and a gate contact disposed over the second cap layer. The second dielectric layer is disposed directly on a top surface of the butted contact.

In some embodiments, the first source/drain contact and the second source/drain contact include cobalt. In some instances, the first cap layer and the second cap layer include fluorine-free tungsten. In some embodiments, the butted contact includes tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece comprising:
a first gate structure including a first cap layer thereon,
a first source/drain contact adjacent the first gate structure,
a second gate structure including a second cap layer thereon,
a second source/drain contact,
an etch stop layer (ESL) over the first source/drain contact and the second source/drain contact, and
a first dielectric layer over the ESL;
forming a butted contact opening to expose the first cap layer and the first source/drain contact;
forming a butted contact in the butted contact opening;
after the forming of the butted contact, depositing a second dielectric layer;
forming a source/drain contact via opening through the second dielectric layer, the ESL, and the first dielectric layer to expose the second source/drain contact; and
forming a source/drain contact via in the source/drain contact via opening.

2. The method of claim 1, further comprising:
after the forming of the source/drain contact via, depositing a third dielectric layer over the source/drain contact via;
forming a gate contact via opening to expose the second cap layer; and
forming a gate contact via in the gate contact via opening.

3. The method of claim 1, further comprising:
before the forming of the source/drain contact via, recessing the second source/drain contact.

4. The method of claim 3, wherein the recessing of the second source/drain contact comprises use of hydrogen peroxide.

5. The method of claim 1, wherein the first cap layer and the second cap layer comprise fluorine-free tungsten.

6. The method of claim 1, wherein the first source/drain contact and the second source/drain contact comprise cobalt and are free of a barrier layer.

7. The method of claim 1, wherein the forming of the butted contact comprises:
depositing a barrier layer over the butted contact opening using physical vapor deposition (PVD);
depositing a metal fill layer over the barrier layer using chemical vapor deposition (CVD); and
planarizing the deposited metal fill layer.

8. The method of claim 7, wherein after the planarizing, a top surface of the butted contact is coplanar with a top surface of the first dielectric layer.

9. The method of claim 7, wherein the metal fill layer comprises tungsten.

10. A method, comprising:
receiving a workpiece comprising:
a first gate structure,
a first source/drain contact adjacent the first gate structure,
a second gate structure,
a second source/drain contact,
an etch stop layer (ESL) over the first source/drain contact and the second source/drain contact, and
a first dielectric layer over the ESL;
forming a butted contact to couple to the first gate structure and the first source/drain contact;
depositing a second dielectric layer over the first dielectric layer and the butted contact;
forming a source/drain contact via through the second dielectric layer, the first dielectric layer, and the ESL to couple the second source/drain contact;
depositing a third dielectric layer over the source/drain contact via and the second dielectric layer; and
forming a gate contact through the third dielectric layer, the second dielectric layer, the first dielectric layer, and the ESL to couple the second gate structure.

11. The method of claim 10, further comprising:
after the forming of the gate contact, planarizing the workpiece until a top surface of the gate contact is coplanar with a top surface of the source/drain contact via.

12. The method of claim 10, wherein the workpiece further comprises:
a first cap layer over the first gate structure;
a second cap layer over the second gate structure;
a first self-aligned capping (SAC) layer over the first cap layer; and
a second SAC layer over the second cap layer.

13. The method of claim 12, wherein a portion of the butted contact extends through the first SAC layer to land on the first cap layer.

14. The method of claim 12, wherein the gate contact extends through the second SAC layer to land on the second cap layer.

15. The method of claim 12, wherein the forming of the butted contact comprises:
forming a butted contact opening to expose a top surface of the first source/drain contact and the first cap layer;
depositing a barrier layer over the butted contact opening using physical vapor deposition (PVD);
depositing a metal fill layer over the barrier layer using chemical vapor deposition (CVD); and
planarizing the deposited metal fill layer.

16. The method of claim 15, wherein the metal fill layer comprises tungsten.

17. A method, comprising:
receiving a workpiece comprising:
an active region comprising a first channel region, a second channel region, a first source/drain region between the first channel region and the second channel region, and a second source/drain region adjacent the second channel region,
a first source/drain contact disposed over the first source/drain region,
a second source/drain contact disposed over the second source/drain region,
a first gate structure over the first channel region,
a first dielectric capping layer over the first gate structure,
a second gate structure over the second channel region,
a second dielectric capping layer over the second gate structure,
an etch stop layer (ESL) disposed on top surfaces of the first dielectric capping layer, the first source/drain contact, the second dielectric capping layer, and the second source/drain contact, and
a first dielectric layer over the ESL;
forming a butted contact to electrically couple to the first gate structure and the first source/drain contact;
depositing a second dielectric layer over the first dielectric layer and the butted contact;
after the depositing the second dielectric layer, forming a source/drain contact via through the second dielectric layer, the first dielectric layer, and the ESL to couple the second source/drain contact; and
depositing a third dielectric layer over the source/drain contact via and the second dielectric layer.

18. The method of claim 17,
wherein the workpiece further includes a first conductive capping layer disposed between the first gate structure and the first dielectric capping layer and a second conductive capping layer disposed between the second gate structure and the second dielectric capping layer
wherein a portion of the butted contact through the first dielectric layer, the ESL and the first dielectric capping layer to contact the first conductive capping layer.

19. The method of claim 18, further comprising:
forming a gate contact through the third dielectric layer, the second dielectric layer, the first dielectric layer, and the ESL to couple to the second conductive capping layer.

20. The method of claim 19, further comprising:
after the forming of the gate contact, planarizing the workpiece until a top surface of the source/drain contact via is exposed.

* * * * *